United States Patent [19]

Fattaruso et al.

[11] Patent Number: 5,136,255

[45] Date of Patent: Aug. 4, 1992

[54] AMPLIFIER CIRCUIT

[75] Inventors: John W. Fattaruso; James R. Hellums, both of Dallas, Tex.

[73] Assignee: Texas Instruments Incorporated, Dallas, Tex.

[21] Appl. No.: 723,477

[22] Filed: Jun. 28, 1991

[51] Int. Cl.⁵ .............................................. H03F 3/45
[52] U.S. Cl. ............................................ 330/9; 330/51; 330/296
[58] Field of Search ................... 330/9, 296, 261, 51

[56] References Cited

U.S. PATENT DOCUMENTS

| | | | |
|---|---|---|---|
| 4,574,250 | 3/1986 | Senderowicz | 330/51 |
| 4,833,418 | 5/1989 | Quintus et al. | 330/9 |
| 4,855,685 | 8/1989 | Hochschild | 330/9 |
| 4,947,135 | 8/1990 | Mijuskovic | 330/9 |
| 5,001,725 | 3/1991 | Senderowicz et al. | 375/28 |

FOREIGN PATENT DOCUMENTS

| | | | |
|---|---|---|---|
| 090104(A1) | 10/1983 | European Pat. Off. | 330/51 |
| 129644(A1) | 1/1985 | European Pat. Off. | 330/9 |
| 54-110766 | 8/1979 | Japan | 330/9 |

OTHER PUBLICATIONS

Electronics Letters, Oct. 9, 1986, vol. 22, No. 21, pp. 1103-1105.

Primary Examiner—Eugene R. LaRoche
Assistant Examiner—Tan Dinh
Attorney, Agent, or Firm—James C. Kesterson; B. Peter Barndt; Richard L. Donaldson

[57] ABSTRACT

An amplification circuit in accordance with the present invention includes an amplifier comprising four inputs. Each of the four inputs is operable to receive a respective analog signal and a respective DC bias signal. Also included is supply circuitry for providing a first and second controlled DC bias signal. Each of the DC bias signals is operable to couple to selected ones of the four inputs of the amplifier.

5 Claims, 2 Drawing Sheets

AMPLIFIER CIRCUIT

TECHNICAL FIELD OF THE INVENTION

This invention relates to electronic circuitry, and more particularly to an amplification circuit which has particular application in an integrator configuration.

BACKGROUND OF THE INVENTION

Amplification circuits are used in various applications such as switched capacitor filters, analog-to-digital converters, and general communications circuits. The particular amplification circuit chosen depends on numerous considerations such as noise level in the amplifier output, bandwidth of the amplified signal, and the magnitude of the voltage supply connected to the amplifier. Conventional amplifier circuits, however, each provide limitations concerning the above-listed considerations. For example, certain amplifiers are only operable for low clock rates and, hence, are not useable in systems where higher clock frequencies (e.g. 10 MHz) are implemented. In particular, these amplifiers include internal component configurations which give rise to substantial phase shifts and, thus, prohibits the device from being used in high frequency applications. Another common problem with known amplifier circuits is that the supply voltage must be adjusted relatively high in order to prevent the amplification components of the circuit from turning off under various circumstances. Still another problem is the difficulty of maintaining a sufficient biasing current in the amplification circuit without providing excess current and wasting power in the circuit.

Each of the limitations of these prior art amplification circuits provides a corresponding limitation in any application in which the circuit is used. Therefore, a need exists for an amplification circuit which is operable to operate at a substantially low power supply voltage, utilize an efficient amount of current, provide high frequency operation, and significantly reduce the amount of input reference voltage noise that is generated by the circuit.

SUMMARY OF THE INVENTION

In accordance with the present invention, an amplification circuit is provided which substantially eliminates or reduces disadvantages and problems associated with prior amplification circuits.

An amplification circuit in accordance with the present invention includes an amplifier comprising four inputs. Each of the four inputs is operable to receive a respective analog signal and a respective DC bias signal. Also included is supply circuitry for providing a first and second controlled DC bias signal. Each of the DC bias signals is operable to couple to selected ones of the four inputs of the amplifier.

The present invention provides numerous technical advantages over prior amplification circuits. One technical advantage is controlled DC biasing of the transistors within the amplifier, thereby ensuring the proper amount of quiescent current for the amplifier. As a result, there is the technical advantage of proper amplifier operation. Another advantage is the controlled amount of power consumption by the amplifier. Still another technical advantage is the applicability of the present invention to very high speed (e.g., 10 MHz) applications. An additional technical advantage is the reduction of noise in the amplified signal. One final technical advantage is the tracking of device characteristics such that the variability of the parameters affecting PMOS devices are compensated for by utilizing PMOS devices to drive other PMOS devices. Similarly, NMOS devices are used to drive NMOS devices to further accomplish device tracking. As a result, changes in parameters such as power supply, temperature, and device fabrication are tracked by these like conductivity-type devices, thereby ensuring proper operation despite any such changes.

DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
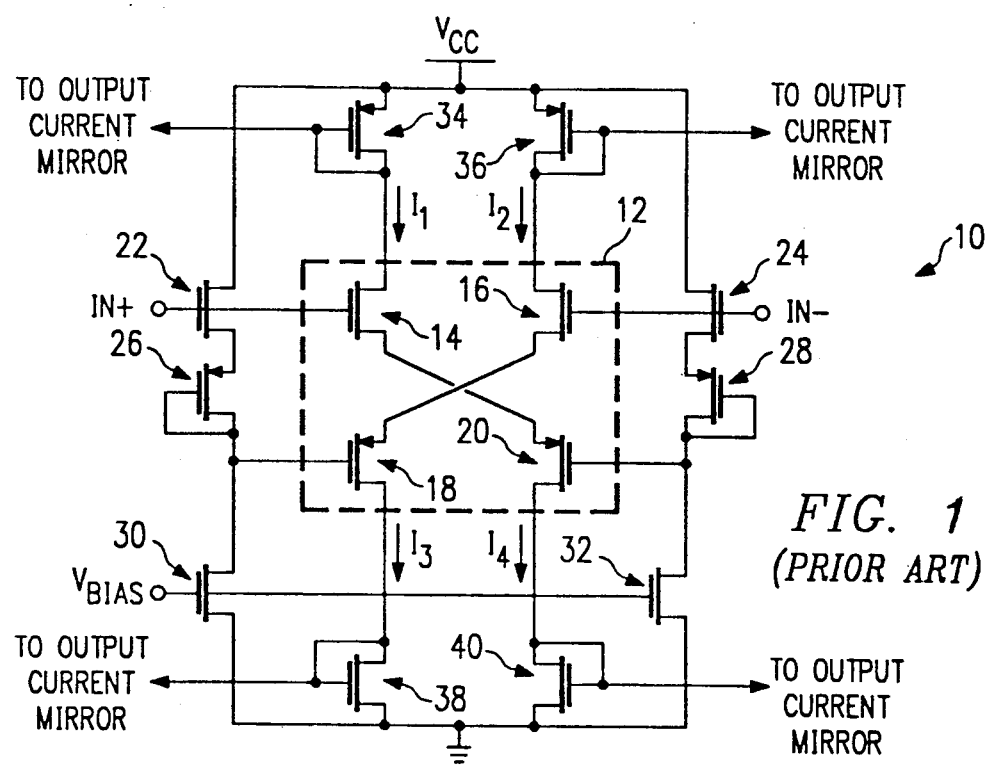
FIG. 1 illustrates a prior art amplifier circuit input stage, wherein the amplification transistors are biased by an input voltage and the input voltage minus two threshold voltages, respectively.

FIG. 1 illustrates a prior art input stage 10 of an amplifier circuit. Input stage 10 is operable to receive and amplify differential voltage signals. In particular, input stage 10 includes four transistors 14, 16, 18 and 20 comprising an amplification block 12. Transistors 14 and 16 comprise NMOS transistors and transistors 18 and 20 comprise PMOS transistors. The gates of transistors 14 and 16 are connected to receive the input stage input signals denoted IN+ and IN−. The drains of transistors 14 and 16 draw current denoted $I_1$ and $I_2$, respectively. The sources of transistors 14 and 16 are cross-coupled to the sources of transistors 20 and 18, respectively. The drains of transistors 18 and 20 provide currents $I_3$ and $I_4$, respectively.

Amplification block 12 is DC biased by four transistors 22, 24, 26 and 28. Transistors 22 and 24 are NMOS transistors and transistors 26 and 28 are PMOS transistors. Transistors 22 and 24 have their drains connected to a power supply voltage, $V_{cc}$. The gates of transistors 22 and 24 are connected to input signals IN+ and IN−, respectively. The sources of transistors 22 and 24 are connected to the sources of transistors 26 and 28, respectively. The gates of transistors 26 and 28 are connected to the respective drains of each of those transistors. Further, the drains of transistors 26 and 28 are additionally connected to the gates of amplification block transistors 18 and 20, respectively.

Input stage 10 further includes current supply transistors 30 and 32, and current mirror transistors 34, 36, 38 and 40. The drains of current supply transistors 30 and 32 are connected to the drains of transistors 26 and 28, respectively. The sources of current supply transistors 30 and 32 are connected to ground. The gates of current supply transistors 30 and 32 are connected together, and are operable to receive a signal from a current mirror in order to supply a current according to principles known in the art. This signal is designated as a voltage, $V_{BIAS}$. Current mirror transistors 34 and 36 are configured in order to mirror currents $I_1$ and $I_2$, respectively, to the output stage (not shown) of the amplifier. In particular, the sources of current mirror transistors 34 and 36 are connected to the power supply voltage, $V_\alpha$, while the drains of transistors 34 and 36 supply currents $I_1$ and $I_2$, respectively. The gates of each of transistors 34 and 36 are connected to the respective drains of those transistors, thereby creating a current mirror configuration as known in the art. As a result, the gates of transistors 34 and 36 may be connected to mirroring transistor configurations in order to provide respective output currents corresponding to, or in proportion to, currents $I_1$ and $I_2$, respectively. Similarly, current mirror transistors 38 and 40 are connected to provide mirroring signals to produce output currents corresponding to currents $I_3$ and $I_4$, respectively. In particular, the drains of transistors 38 and 40 receive currents $I_3$ and $I_4$, respectively. The sources of transistors 38 and 40 are connected to ground. The gates of transistors 38 and 40 are each connected to the drains of the respective transistors, again thereby forming a current mirror configuration. As a result, the gates of transistors 38 and 40 are directed to output current mirror configurations so that output currents may be generated corresponding to the currents $I_3$ and $I_4$, respectively.

In operation of input state 10, inputs IN+ and IN− are used to receive both a DC biasing signal and an AC analog signal to be amplified. The DC biasing signal attempts to bias the transistors within amplification block 12 to a desired quiescent level. For example, a DC voltage applied at input IN+ is connected to bias the gate of transistor 14. The gate of transistor 18, however, is biased at a voltage level which is two threshold voltages below the DC voltage level at input IN+. In particular, one voltage threshold drop occurs between the gate and source of NMOS transistor 22. Still another voltage threshold drop occurs between the source and gate of PMOS transistor 26. It should be noted that, because transistor 22 is an NMOS transistor and transistor 26 is a PMOS transistor, these two threshold voltages are not necessarily identical. Nonetheless, the bias voltage at the gate of transistor 18 will be at a level which is two threshold voltages below the bias level at the gate of transistor 14. In ideal circumstances, this two threshold voltage difference ensures that both transistors 14 and 18 both conduct quiescent current.

One advantage of input stage 10 is that the transistors of the amplification block are connected to independent transistors of the same conductivity-type. For example, the gate of NMOS transistor 14 is connected to the gate of NMOS transistor 22 and, thus, both transistors are NMOS in conductivity-type. As another example, the gate of PMOS transistor 18 is connected to the gate of PMOS transistor 26. As a result, the "like-type" transistors will track one another in operation despite changes in parameters which may affect their operation. Such parameters include temperature, power supply and process considerations or fluctuations.

The DC biasing scheme of input stage 10, however, may incur various problems under certain conditions. For example, at low supply voltages (e.g., 4.5 volts), the DC bias level may be insufficient to maintain each of the transistors of input stage 10 in an operable condition.

Naturally, should any of the transistors become inoperable, the entire amplification process is affected and possibly destroyed. Thus, in the example where the input supply voltage is 4.5 volts, the DC bias at inputs IN+ and IN− is half that voltage and, hence, is 2.25 volts. Thus, 2.25 volts appears at the gate of transistor 14 while 2.25 volts minus two threshold voltages appears at the gate of transistor 18. The same relative biasing levels is applied to the gates of transistors 16 and 20, respectively. Depending on the values of the two threshold voltages, it may be appreciated that the DC biasing voltage at the gates of transistors 18 and 20 may be substantially low (e.g., 2.25 volts−0.7 volts−1.0 volts=0.55 volts). As a result, there may be insufficient voltage to bias these transistors and they may undesirably operate in the triode region rather than in saturation as is desired. This undesirable effect could significantly reduce the gain of the amplifier. Alternatively, these transistors may provide insufficient current to mirroring transistors 38 and 40, thereby also destroying the reliability of the amplification circuit.

Another limitation of input stage 10 is that the phase shift of transistors 18 and 20 is not matched with transistors 14 and 16 at high frequencies. Still another problem is the use of a source follower configuration at the amplifier inputs IN+ and IN− (i.e., transistors 22 and 24). These source followers often contribute a significant amount of noise in the amplified signal. In addition, transistors 26, 28, 30 and 32 also contribute comparable amounts of noise. Thus, it may be appreciated that input stage 10 has various limitations, particularly in applications involving high frequency and/or low voltage supply systems.

Figure 2:
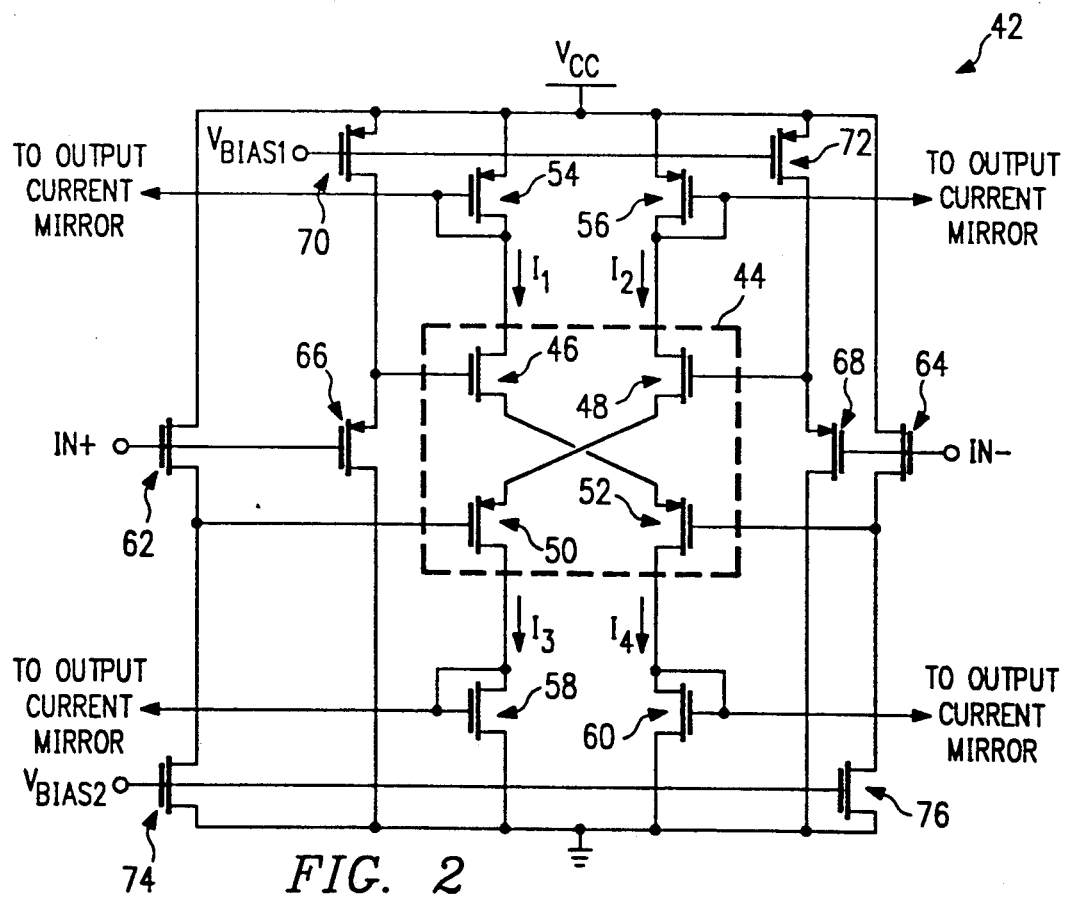
FIG. 2 illustrates a prior art amplifier input stage, wherein the amplification transistors are biased by one threshold voltage above the input voltage and one threshold voltage below the input voltage, respectively.

FIG. 2 illustrates an alternative prior art input stage 42 of an amplification circuit. Input stage 42 includes an amplification block 44 having four transistors 46, 48, 50 and 52. The components of amplification block 44 are the same in type and configuration as transistors 14, 16, 18 and 20, respectively, of amplification block 12 (shown in FIG. 1). Thus, transistors 46 and 48 are NMOS transistors and transistors 50 and 52 are PMOS transistors. Further, transistors 46 and 48 pull current through mirroring transistors 54 and 56, the current being denoted as $I_1$ and $I_2$, respectively. Additionally, amplification block 44 provides current denoted $I_3$ and $I_4$ to mirroring transistors 58 and 60, respectively. Each of mirroring transistors 54, 56, 58 and 60 provide signals to respective output current mirrors in order to produce output currents proportional to the mirrored currents.

The quiescent current biasing circuit in FIG. 2 is different than that of input stage 10 of FIG. 1. In particular, amplification block 44 is DC biased by transistors 62, 64, 66 and 68, and includes current supply transistors 70, 72, 74 and 76. The sources of current supply transistors 70 and 72 are connected to the power supply voltage, $V_\alpha$. The drains of current supply transistors 70 and 72 are connected to the sources of transistors 66 and 68. Current supply transistors 70 and 72 are PMOS transistors and current supply transistors 74 and 76 are NMOS transistors. The drains of transistors 66 and 68 are connected to ground, and the gates of those transistors are connected to the input terminals IN+ and IN−, respectively. Current supply transistors 74 and 76 have their sources connected to ground, and their drains connected to the sources of transistors 62 and 64, respectively. The gates of current supply transistors 74 and 76 are connected to one another, and are operable to receive a bias voltage, $V_{BIAS2}$, from a current mirroring transistor (not shown). The gates of current supply transistors 70 and 72 are connected to one another, and are operable to receive a bias supply voltage $V_{BIAS1}$ from a current mirroring transistor (not shown). The gates of transistors 62 and 64 are connected to the gates of transistors 66 and 68, and are further connected to input stage 42 inputs IN+ and IN−, respectively.

The DC operation and biasing of input stage 42 is as follows. A common mode DC signal is connected to both inputs IN+ and IN−. Transistor 66 receives the DC signal at input IN+, increases the voltage by one threshold voltage, and applies the increased voltage to the gate of transistor 46. Oppositely, transistor 62 receives the DC signal from input IN+, decreases that voltage by one threshold voltage, and applies the decreased voltage to the gate of transistor 50. As a result, it may be appreciated that the difference in gate potential between transistors 46 and 50 is again the difference of two threshold voltages, those threshold voltages being across a PMOS and NMOS transistor, respectively. A similar two threshold voltage difference is applied to the gates of transistors 48 and 52, respectively. Unlike input stage 10 of FIG. 1, however, input stage 42 of FIG. 2 does not incur the low power supply voltage problems discussed above. This improved result occurs because the configuration of FIG. 2 steps up and steps down the input DC bias by one threshold voltage thereby ensuring that the potentials at the gates of transistors 46 and 50, and transistors 48 and 52, are always plus or minus one threshold voltage from the DC biasing signal at inputs IN+ and IN−. Thus, even in instances when the DC bias voltage is relatively low (e.g., 2.25 volts), the gate potential of transistor 46 will be one threshold voltage higher than 2.25 volts while the gate potential at transistor 50 will be one threshold voltage below 2.25 volts. Again, transistors 48 and 52 are biased in the same manner as transistors 46 and 50, respectively, and so the gates of those transistors should also be one threshold voltage above and below 2.25 volts.

Although input stage 42 of FIG. 2 avoids the problem of low voltages associated with input stage 10 of FIG. 1, input stage 42 incurs a tradeoff limitation because there is no "like-type" transistor tracking as there is in connection with input stage 10 of FIG. 1 above. In particular, the gate voltage of transistor 46, which is an NMOS transistor, is directly affected by the threshold voltage across transistor 66 which is a PMOS transistor. As a result, any type of condition such as temperature, process or power supply which may adversely effect either a PMOS or an NMOS transistor may not have the same effect on the opposing conductivity-type transistor. Thus, while PMOS transistor 66 may be affected by one of these various types of parameters, transistor 46 may not be equally affected and, as a result, there is no tracking of operation as is the case for input stage 10. Without voltage tracking, the difference in voltages between the gate potentials at transistors 46 and 50, and transistors 48 and 52, may not remain at two threshold voltages. If this difference in gate voltages become too small, the entire amplifier may turn off because quiescent current cannot flow within its circuitry. Alternatively, if this difference in voltage becomes too large, then an increased amount of quiescent current may flow through the circuitry, thereby wasting a significant amount of power. Additionally, input stage 42 also includes source followers (transistors 62 and 64, and 66 and 68) which drive amplification block 44. Accordingly, the noise problems created by the source followers and discussed in connection with input stage 10 are also evident in input stage 42.

Figure 4:
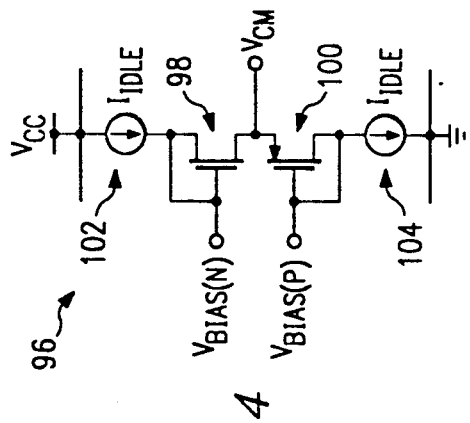
FIG. 4 illustrates a circuit for generating bias voltages for the PMOS and NMOS devices of FIG. 3.
Figure 5:
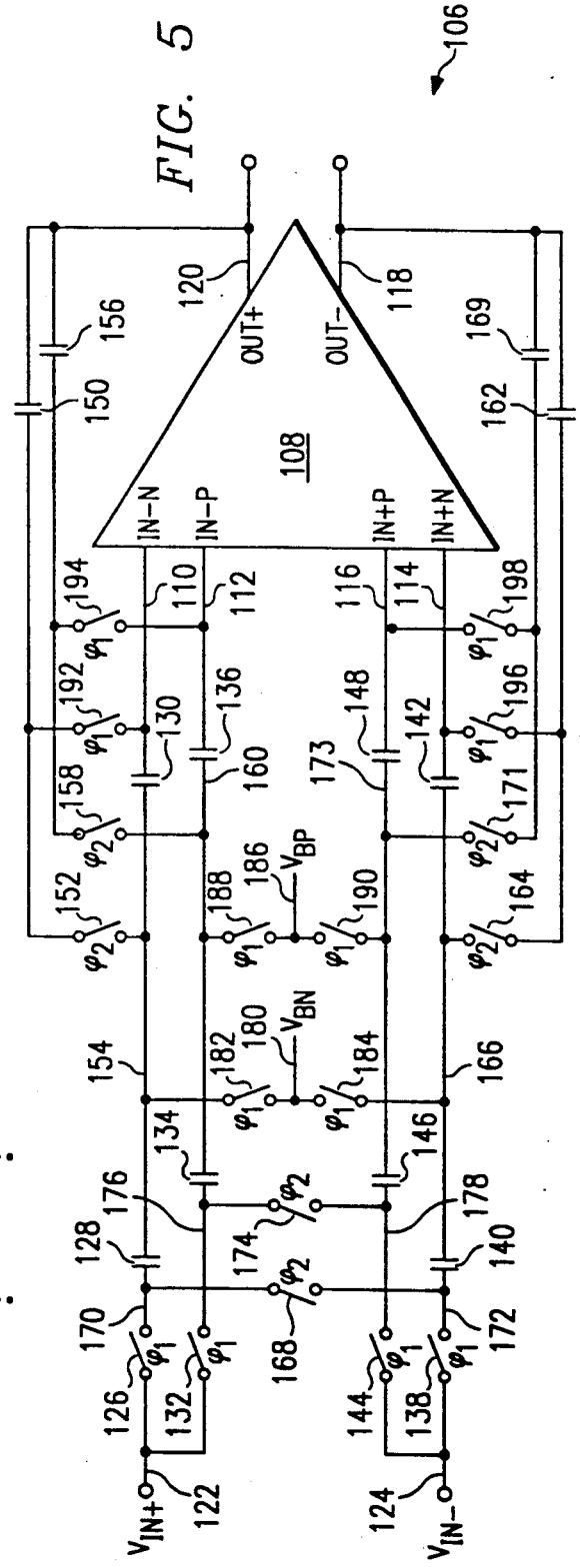
FIG. 5 illustrates an integrator circuit including the amplification circuit of FIG. 3 and driven by the voltages generated by the circuit of FIG. 4.

From a review of input stages 10 and 42 of FIGS. 1 and 2, it may be appreciated that there exists a need for an improved amplifier input stage which substantially reduces the disadvantages associated with those two circuits. This improved circuit may be used in many amplification circuits; and may be further used within an integrator circuit to accomplish improved results with particular application in high speed systems. Accordingly, the preferred embodiments of the present invention are illustrated in FIGS. 3–5 of the drawings, like numerals being used to refer to like and corresponding parts of the various drawings.

Figure 3:
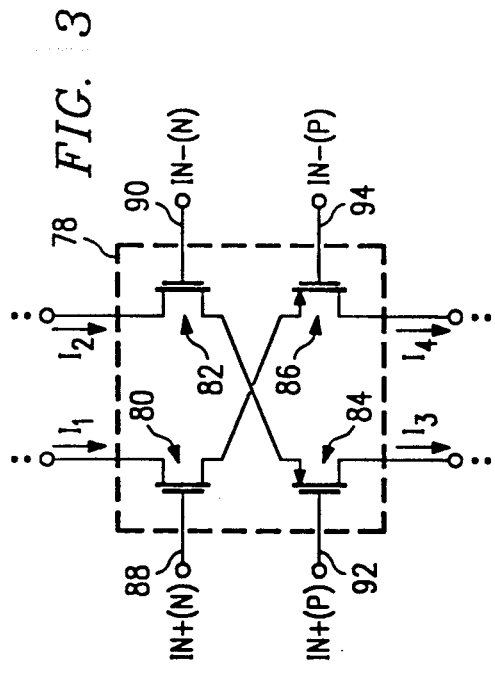
FIG. 3 illustrates an amplification stage having four independent inputs.

FIG. 3 illustrates an amplification block 78 in accordance with the present invention. Amplification block 78 includes four transistors 80, 82, 84 and 86. Transistors 80 and 82 are preferably NMOS transistors and transistors 84 and 86 are preferably PMOS transistors. Transistors 80 and 82 draw currents designated as $I_1$ and $I_2$, respectively. These currents may be drawn through current mirrors in a manner similar to that illustrated in FIGS. 1 and 2, above. Likewise, transistors 84 and 86 provide currents $I_3$ and $I_4$, respectively. Further, currents $I_3$ and $I_4$ may be provided to various mirroring circuitry so that proportional output current ultimately may be derived in the output of the amplifier circuit. With reference to specific device connections, the drains of transistors 80 and 82 are connected to receive currents $I_1$ and $I_2$, respectively. The sources of transistors 80 and 82 are connected to the sources of transistors 84 and 86. The drains of transistors 84 and 86 provide currents $I_3$ and $I_4$, respectively.

One aspect of the present invention is that amplification block 78 of FIG. 3 includes four independent inputs 88, 90, 92 and 94. By providing four independent inputs, independent controlled DC voltages may be applied to each of the inputs in order to more accurately control the quiescent current flowing through amplification block 78. In particular, it is desirable to generate sufficient bias voltages for each of the inputs in order to maintain transistors 80, 82, 84 and 86 in operating condition with a sufficient amount of quiescent current passing therethrough, but without permitting those transistors to waste power by passing excessive quiescent current, and without permitting them to shut off. Thus, it may be appreciated that amplification block 78 includes separate differential inputs for both the NMOS and PMOS devices. As a result, inputs 88 and 90 define differential inputs IN+(N) and IN−(N), thereby providing a differential input for the NMOS devices of the amplifier. Similarly, inputs 92 and 94 provide inputs IN+(P) and IN−(P), thereby providing a differential input for the PMOS devices of amplification block 78.

The use of four independent inputs provides improved DC biasing over the prior art. For example, the use of four inputs eliminates the need to step up or down two existing DC voltages, thereby eliminating some of the problems discussed in connection with FIGS. 1 and 2. Further, by removing the source follower configurations of the prior art, the bandwidth and noise limitations associated with those source followers are also removed. As a result, amplification block 78 of FIG. 3 does not incur many of the limitations as did input stages 10 and 42 of FIGS. 1 and 2, respectively.

FIG. 4 illustrates a bias supply circuit 96. Bias supply circuit 96 provides the appropriate bias voltages, $V_{BIAS(P)}$ and $V_{BIAS(N)}$ to be used in connection with amplification block 78 discussed in FIG. 3. In particular, bias supply circuit 96 includes two transistors 98 and 100, and two current sources 102 and 104. Current sources 102 and 104 may be provided by any techniques known in the art such as current mirroring or the like. Current source 102 is connected from the power supply voltage, $V_\alpha$, to the drain of transistor 98. The source of transistor 98 is connected to the source of transistor 100. The second current source 104 is connected between the drain of transistor 100 and ground. Transistor 98 is preferably an NMOS transistor and transistor 100 is preferably a PMOS transistor. Both transistors 98 and 100 are connected in a gate-to-drain (i.e., diode-connected) manner. As a result, transistors 98 and 100 are guaranteed to operate in saturation. Accordingly, transistors 98 and 100 will provide a known drain-to-source voltage in response to a known current passing through them. In particular, current sources 102 and 104 supply a known quiescent, or idle, current $I_{IDLE}$ which will cause a known voltage across the drain/source of transistors 98 and 100. Thus, because the gate of each transistor is connected to the respective transistor drain, the gate voltage is also known and controlled for a given quiescent current. As a result, a controllable voltage is formed at the gates of both transistors 98 and 100. This controllable voltage provides a bias voltage for coupling to the NMOS and PMOS inputs of amplification block 78 discussed in connection with FIG. 3.

From the above, it may be appreciated that the voltage from NMOS transistor 98 may be used to drive NMOS transistors 80 or 82 in FIG. 3. Similarly, the voltage from PMOS transistor 100 may be used to drive either PMOS transistor 84 or 86 in FIG. 3. Thus, the tracking effect described in connection with input stage 10 of FIG. 1 is accomplished through the combination of bias supply circuit 96 and amplification block 78 of FIGS. 4 and 3, respectively. No shifting of two DC bias voltages is used, however, and therefore the low supply voltage problem of FIG. 1 is eliminated. Instead, the inventive configuration of FIG. 3 ensures the proper amount of current and voltage may be controlled due to the use of a current source through a diode-connected device which creates a known voltage. Thus, the controlled voltage ensures that all transistors will remain conducting in an efficient manner. As a result, it may be appreciated that the advantages provided by input stages 10 and 42 of FIGS. 1 and 2, respectively, are each evident in the combination of the inventive embodiments set forth in FIGS. 3 and 4. The source follower configurations of FIGS. 1 and 2 are also eliminated. Thus, the particular problems associated with input stages 10 and 42 are substantially reduced or eliminated in the combination of these inventive embodiments. Specifically, the large contribution to input referred noise is greatly reduced in comparison to the prior art. The remaining discussion illustrates a particular circuit for coupling the bias supply circuit 96 of FIG. 4 to an amplifier in the form of an integrator circuit.

FIG. 5 illustrates an integrator circuit 106 operable to incorporate the concepts discussed in connection with FIGS. 3 and 4 above. Integrator circuit 106 includes an amplifier 108 having four inputs 110, 112, 114 and 116. In particular, inputs 110 and 112 define inverting inputs for the NMOS and PMOS transistors within amplifier 108 and, therefore, are designated as IN−(N) and IN−(P). Similarly, inputs 114 and 116 are non-inverting amplifier inputs for the NMOS and PMOS devices within amplifier 108, respectively, and correspondingly are designated as IN+(N) and IN+(P). Amplifier 108 further includes an inverting output 118 and a non-inverting output 120.

Integrator circuit 106 is configured to include a switched capacitor network operable to connect analog input signals and DC bias signals to the four inputs of amplifier 108. The specific interconnections of this switched capacitor network are as follows. Integrator circuit 106 includes a non-inverting input node 122 and an inverting input node 124. A switch 126 is connected between non-inverting input node 122 and an input capacitor 128. Capacitor 128 is further connected to an offset voltage capacitor 130 which is connected to input 110 of amplifier 108. Non-inverting input node 122 is also connected to a switch 132 which is connected to an input capacitor 134. Capacitor 134 is connected to an offset voltage capacitor 136 which is connected to input 112 of amplifier 108. Inverting input node 124 has similar connections to amplifier 108. Accordingly, inverting input node 124 is connected to a switch 138 which is connected to an input capacitor 140. Capacitor 140 is further connected to an offset voltage capacitor 142 which is connected to input 114 of amplifier 108. Similarly, inverting input node 124 is connected to a switch 144 which is connected to an input capacitor 146. Capacitor 146 is further connected to an offset voltage capacitor 148 which is connected to input 116 of amplifier 108. Switches 126, 132, 138 and 144 all open and close in response to a first clock signal, $\phi_1$.

The integration interconnections for integrator circuit 106 are as follows. Non-inverting output 120 is connected to an integration capacitor 150. Capacitor 150 is connected to a switch 152 which is connected to a node 154 between capacitors 128 and 130. A second integration path from non-inverting output 120 is formed by connecting output 120 to an integration capacitor 156. Capacitor 156 is connected to a switch 158 which is further connected a node 160 between capacitors 134 and 136. Inverting output 118 of amplifier 108 also includes two integration paths to the non-inverting inputs 114 and 116 of amplifier 108. In particular, inverting output 118 is connected to an integration capacitor 162 which is connected to a switch 164. Switch 164 is further connected to a node 166 between capacitors 140 and 142. Similarly, inverting output 118 is connected to an integration capacitor 169 which is connected to a switch 171. Switch 171 is further connected to a node 173 between capacitors 146 and 148. Switches 152, 158, 164 and 171 all open and close in response to a second clock signal, $\phi_2$, which is a non-overlapping clock signal with respect to the first clock signal, $\phi_1$. A switch 168 is connected between a node 170 between switch 126 and capacitor 128, and a node 172 between switch 138 and capacitor 140. Switch 168 operates in accordance with the second clock signal, $\phi_2$. Similarly, a switch 174 is connected between a node 176 between switch 132 and capacitor 134 and a node 178 between switch 144 and capacitor 146. Switch 174 also operates in accordance with $\phi_2$.

The DC biasing voltages generated in accordance with the principles discussed in connection with FIG. 4 are connected to amplifier 108 as follows. A DC bias node 180 is connected to switches 182 and 184, each of which operate in accordance with $\phi_1$. Switch 182 is further connected to node 154 while switch 184 is further connected to node 166. DC bias node 180 is operable to receive the NMOS biasing voltage, $V_{BIAS(N)}$. Similarly, a DC bias node 186 is connected to a switch 188 and a switch 190, both of which also operate in accordance with $\phi_1$. Switch 188 is further connected to node 160 while switch 190 is further connected to node 173. DC bias node 186 is operable to receive the PMOS DC biasing voltage, $V_{BIAS(P)}$.

The switching interconnections to offset voltage capacitors 130, 136, 148 and 142 are as follows. A switch 192 is connected between integration capacitor 150 and the inverting NMOS input 110 of amplifier 108. Similarly, a switch 194 is connected between integration capacitor 156 and the inverting PMOS input 112 of amplifier 108. Oppositely, a switch 196 is connected between integration capacitor 162 and the non-inverting NMOS input 114 of amplifier 108. Similarly, a switch 198 is connected between integration capacitor 169 and the non-inverting PMOS input 116 of amplifier 108. Switches 192, 194, 196 and 198 all operate in accordance with the first clock signal, $\phi_1$.

The operation of integrator circuit 106 is as follows. When clock signal $\phi_1$ is enabled, switches 182, 184, 188 and 190 close. Switches 126, 132, 144 and 138 will also close, thereby charging input capacitors 128, 134, 146 and 140, respectively, with the input analog signal applied to inputs 122 and 124. Capacitors 128 and 140, and 134 and 146, are also charged With DC biasing voltages, $V_{BIAS(N)}$ and $V_{BIAS(P)}$, respectively.

Switches 192, 194, 196 and 198 also close when $\phi_1$ is enabled, thereby charging offset voltage capacitors 130, 136, 142 and 148, respectively, with an amplifier input offset voltage provided by outputs 118 and 120. This offset voltage will offset the input signal to amplifier 108 to correct for the offset of the output signals of the amplifier. It should be noted that this offset voltage feature including capacitors 130, 136, 148 and 142 provides an advantageous reduction of the offset resulting from small amplifier asymmetries, but is separable from the inventive embodiments which apply both DC biasing and an AC signal to a four input amplifier. Thus, the offset voltage capacitors 130, 136, 148 and 142, while preferable, could be eliminated where offset voltage reduction is of less importance.

Clock signals $\phi_1$ and $\phi_2$ are non-overlapping clock signals. Accordingly, when $\phi_2$ is enabled, $\phi_1$ is disabled and the switches controlled by $\phi_1$ open while the switches controlled by $\phi_2$ close. Thus, when $\phi_2$ is enabled, switches 168, 152 and 164 close and the differential charge across input capacitors 128 and 140 is inserted into the differential summing nodes 154 and 166. As a result, this charge redistributes on integration capacitors 150 and 162 which perform the integrating function. Similarly, the differential charge on input capacitors 134 and 146 is inserted through closed switches 174, 158 and 171 to differential summing nodes 160 and 173, and further redistributed to integration capacitors 156 and 169, respectively. Thus, after $\phi_2$, an integrated charge is stored on capacitors 150, 156, 169 and 162.

From the above, it may be appreciated that amplifier 108 in integrator circuit 106 is operable to receive both AC and DC input signals at its four different inputs. As a result, the controlled PMOS and NMOS voltages generated in accordance with bias supply circuit 96 of FIG. 4 may be applied to the amplification components within amplifier 108. Two sets of input capacitors are provided including first, capacitors 128 and 140 and second, capacitors 134 and 146 for temporarily storing both the input AC signal and the DC biasing signal. The controlled voltages provided by bias supply circuit 96 to these capacitors ensure that each of the transistors within amplifier 108 remain on and operate at a controlled quiescent current without wasting excessive quiescent current. When $\phi_2$ is enabled, integration occurs by the passage of charge to two sets of capacitors including first, capacitors 150 and 162 and, second, capacitors 156 and 168. A proper integration process is ensured because the proper DC bias previously existing on the first two sets of input capacitors is successfully transferred to the two sets of integration capacitors. Additionally, the elimination of the source followers used in the prior art also eliminates the noise attributed thereto. As a result, integrator 106 provides improved power consumption, reduced noise output and high speed capabilities.

Although the present invention has been described in detail, it should be understood that any modifications, substitutions or alterations may be made hereto without departing from the spirit and scope of the invention as defined by the following claims. For example, the switches described herein may be implemented in CMOS, NMOS or PMOS technology, or still other switching devices known or selected by one skilled in the art may be used. Additionally, various devices herein have been described as directly connected to other devices, but alternatively could be coupled through intermediate devices. Similarly, in certain instances, an intermediate device coupling two devices may be removed, thereby directly connecting the two devices without deviating from the scope of the intended invention.

What is claimed is:

1. A method of providing first and second DC bias signals and first and second analog signals to an amplification circuit comprising an amplifier, the method comprising:

coupling the first and second analog signals to respective first and second capacitors during a first clock cycle;

coupling the first DC bias signal to the first and second capacitors during the first clock cycle;

coupling the first and second analog signals to respective third and fourth capacitors during the first clock cycle; and coupling the second DC bias signal to the third and fourth capacitors during the first clock cycle, wherein the first, second, third and fourth capacitors are each coupled to a respective input of the amplifier.

2. The method of claim 1 and further comprising:

coupling the first and third capacitors to fifth and sixth capacitors during a second clock cycle, wherein the fifth and sixth capacitors are coupled between a first output of the amplifier and respective first and second inputs of the amplifier; and coupling the fourth and second capacitors to seventh and eighth capacitors during the second clock cycle, wherein the seventh and eighth capacitors are coupled between a second output of the amplifier and respective third and fourth inputs of the amplifier.

3. The method of claim 1 wherein the first and second DC bias signals are generated by the steps of:

passing a first current through a first circuit operable to produce a known voltage in response to the first current; and passing a second current through a second circuit operable to produce a known voltage in response to current provided from said second current device.

4. The method of claim 1 and further comprising:
coupling an offset signal from a first output of the amplifier to a first capacitor connected to a first input of the amplifier;
coupling an offset signal from a first output of the amplifier to a second capacitor connected to a second input of the amplifier;
coupling an offset signal from a second output of the amplifier to a third capacitor connected to a third input of the amplifier; and
coupling an offset signal from a second output of the amplifier to a fourth capacitor connected to a fourth input of the amplifier.

5. The method of claim 4 wherein each of the offset signals are coupled to the respective capacitors during a second clock cycle which is non-overlapping with respect to the first clock cycle.

* * * * *